US008536917B2

(12) United States Patent
Hertle et al.

(10) Patent No.: US 8,536,917 B2
(45) Date of Patent: Sep. 17, 2013

(54) DUTY CYCLE ADJUSTMENT CIRCUIT

(75) Inventors: Juergen Hertle, Rueschlikon (CH);
Christian I. Menolfi, Rueschlikon (CH);
Thomas H. Toifl, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/367,777

(22) Filed: Feb. 7, 2012

(65) Prior Publication Data

US 2013/0200934 A1 Aug. 8, 2013

(51) Int. Cl.
*H03K 3/017* (2006.01)

(52) U.S. Cl.
USPC .............................. 327/175; 327/172; 327/176

(58) Field of Classification Search
USPC ................................................... 327/172–176
See application file for complete search history.

(56) References Cited

U.S. PATENT DOCUMENTS

| | | | |
|---|---|---|---|
| 7,268,603 B2 * | 9/2007 | Baker et al. | 327/175 |
| 7,292,499 B2 | 11/2007 | Byun | |
| 7,456,667 B2 * | 11/2008 | Taylor et al. | 327/175 |
| 7,598,779 B1 * | 10/2009 | Wang et al. | 327/108 |
| 2008/0186068 A1 | 8/2008 | Heightley | |
| 2008/0315929 A1 | 12/2008 | Mnich | |
| 2010/0225372 A1 | 9/2010 | Satoh et al. | |

OTHER PUBLICATIONS

Menolfi, C., et al., "A 16Gb/s Source-Series Terminated Transmitter in 65nm CMOS SOI," ISSCC Dig. Tech. Papers, pp. 446-447, Feb. 2007.
Savoj, J., et al., "A CMOS interface circuit for detection of 1.2Gb/s RZ data," IEEE International Solid-State Circuits Conference (ISSCC) Dig. Tech. Papers, pp. 278-279, Feb. 1999.
International Search Report and Written Opinion; International Application No. PCT/IB2013/050356/ International Filing Date: Jan. 15, 2013; Date of nnailing: Jun. 20, 2013; 12 pages.

* cited by examiner

*Primary Examiner* — Long Nguyen
*Assistant Examiner* — Thomas Skibinski
(74) *Attorney, Agent, or Firm* — Cantor Colburn LLP; Daniel Morris

(57) ABSTRACT

A duty cycle adjustment circuit includes a clock signal input node; a clock signal output node; a control voltage generation circuit coupled to the clock signal input node; and a first inverter configured to receive an inverter input signal comprising a sum of an input clock signal received at the clock signal input node and a control voltage received from the control voltage generation circuit, and to output an output clock signal at the clock signal output node, wherein variation of the control voltage is configured to vary a duty cycle of the output clock signal.

20 Claims, 5 Drawing Sheets

DUTY CYCLE ADJUSTMENT CIRCUIT

BACKGROUND

This disclosure relates generally to the field of computer hardware, and more particularly to a circuit for adjustment of a duty cycle of a clock signal in a computer hardware system.

Electronics and computing systems employ clock signals to control the timing of various components of such systems, such as data transmitters. Modern electronics systems may require clock circuits that operate at very high speeds. High speed input/output links between computers, for example, must conform to standards that may require transmitter speeds above 20 gigabits per second. At such speeds, the duty cycle of the clock signal that controls the components of the electronics system is important. The duty cycle of a clock signal refers to the amount of time a clock signal exhibits a first logic state, for example a logic high, versus the amount of time the clock signal exhibits a second logic state, for example a logic low. A clock signal exhibits a 50% duty cycle if the amount of time that the clock signal exhibits the first logic state is the same as the amount of time the clock signal exhibits the second logic state. Duty cycle distortion is the variance that a particular clock signal exhibits from a desired duty cycle. Duty cycle distortion of a clock signal may cause performance degradation in a high speed electronics system, as many modern electronics systems require a precise clock signal for proper operation. For example, in high-speed data transmission systems, where data is transmitted on both half-cycles of the clock, any clock duty-cycle distortion directly affects the data eye opening and therefore the reliability of the overall system.

For systems that use both the rising and the falling edges of a clock signal for timing, a non-optimal clock signal duty cycle may require a setting the clock signal at a lower clock frequency, reducing system performance. A duty cycle error of just 5% (e.g., from 50% to 45%), for instance, may require a system clock to run at a maximum speed that is up to 10% lower, causing significant impact on system performance. Multi-phase clocking systems often require a symmetrical wave shape that is characteristically desired to operate at 50% duty cycle. However, other applications may require a duty cycle other than 50%. One use of non-50% duty cycle is in digital clocking where pulse-mode latching is used rather than edge-latching, in order to reduce the setup-hold overhead associated with the latches. Actual duty cycles typically do not have precisely the desired value. Even if a clock signal has the required duty cycle at some point in the system, (e.g., at the output of an on-chip voltage controlled oscillator), the duty cycle will deviate from the required percentage as the clock signal is buffered and distributed throughout the chip.

BRIEF SUMMARY

In one aspect, a duty cycle adjustment circuit includes a clock signal input node; a clock signal output node; a control voltage generation circuit coupled to the clock signal input node; and a first inverter configured to receive an inverter input signal comprising a sum of an input clock signal received at the clock signal input node and a control voltage received from the control voltage generation circuit, and to output an output clock signal at the clock signal output node, wherein variation of the control voltage is configured to vary a duty cycle of the output clock signal.

In another aspect, a method for duty cycle adjustment of a clock signal by a duty cycle adjustment circuit comprising a first inverter includes receiving an input clock signal at clock signal input; receiving a control voltage from a control voltage generation circuit; inputting a sum of the input clock signal and the control voltage to an input of the first inverter; outputting an output clock signal at a clock signal output of the first inverter; and varying the control voltage by the control voltage generation circuit to vary a duty cycle of the output clock signal.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGS..

DETAILED DESCRIPTION

Embodiments of a duty cycle adjustment circuit and methods of operating a duty cycle adjustment circuit are provided, with exemplary embodiments being discussed below in detail. A clock signal may be input into a circuit for duty cycle restoration and cleanup that is based on an alternating current (AC) coupled inverter with resistive feedback. The resistive feedback biases the inverter at the inverter's trip point ($V_{trip}$), which is the equilibrium state for outputting a clock signal having an approximately 50% duty cycle at the inverter output. Further control and adjustment of the duty cycle is achieved by adding a control voltage ($V_{control}$) to the clock signal at the inverter input. The $V_{control}$ is equal to $V_{trip}$ plus a delta voltage ($\delta V$). Variation of $\delta V$ allows variation of the duty cycle of the clock signal at the inverter output over a certain range, so that the duty cycle may be adjusted as necessary to meet system requirements. The duty cycle adjustment circuit may be a closed loop system; i.e., $\delta V$ may be varied based on measurement of the duty cycle of the clock signal at the inverter output in order to maintain the duty cycle of the output clock signal at a target duty cycle for the system.

$V_{control}$ (i.e., $V_{trip}+\delta V$) may be generated and varied using any appropriate circuitry. In some embodiments, $V_{trip}$ may be derived from a control voltage inverter that is substantially identical to the main inverter in the duty cycle adjustment circuit. The control voltage inverter is biased at $V_{trip}$ in order to provide $V_{trip}$ at the control voltage input to the main inverter. $\delta V$ comprises a programmable offset voltage that is added to $V_{trip}$. $\delta V$ may be generated by a programmable current source/sink in some embodiments. In other embodiments the $\delta V$ generator may comprise a variable current source (such as a current digital-analog converter) connected in series with a resistor in some embodiments; adjustment of the variable current source output produces δV across the resistor. Further, in embodiments comprising a differential duty-cycle adjustment circuit, two $V_{control}$ voltages may be generated: $V_{trip}+δV$ and $V_{trip}-δV$.

Figure 1:
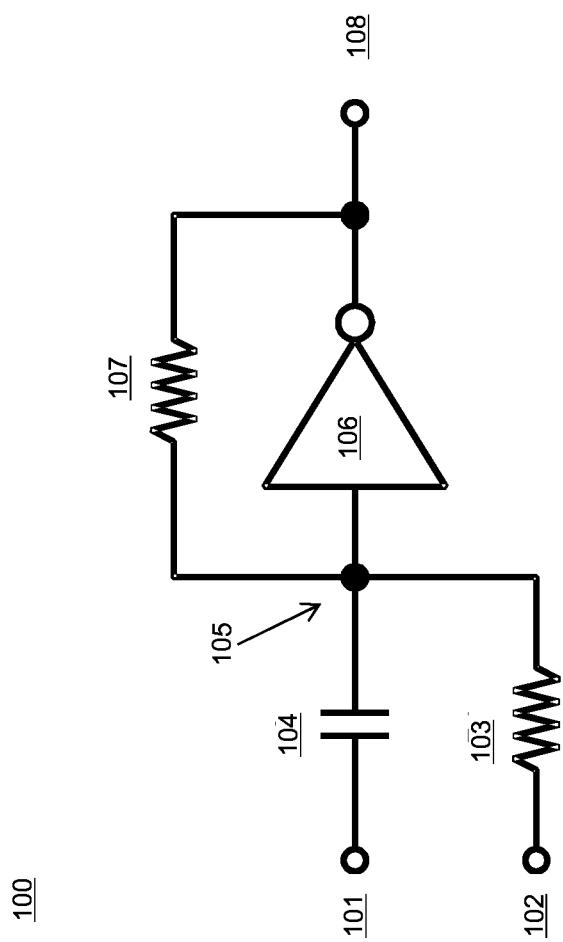
FIG. 1 is a circuit diagram illustrating an embodiment of a duty cycle adjustment circuit.

FIG. 1 is a circuit diagram showing an embodiment of a duty cycle adjustment circuit 100. Duty cycle adjustment circuit 100 includes a clock input 101, control voltage input 102, control voltage resistor 103, capacitor 104, inverter input node 105, inverter 106, feedback resistor 107, and clock output 108. The control voltage input 102 supplies $V_{control}$, which is equal to $V_{trip}+δV$, to the inverter input node 105, where $V_{control}$ is added to the clock signal received from clock input 101 and supplied to inverter 106. The duty cycle of the output clock signal at clock output 108 may be varied by variation of $V_{control}$, which is accomplished by variation of δV. Any appropriate circuitry may be used to vary δV. The variation of δV may be performed by closed loop control; i.e., δV may be varied based on the observed duty cycle of the output clock signal at clock output 108 in order to maintain the output clock signal at a target duty cycle required by the system that includes duty cycle adjustment circuit 100. This closed loop adjustment of δV may be performed by any appropriate logic.

Figure 2:
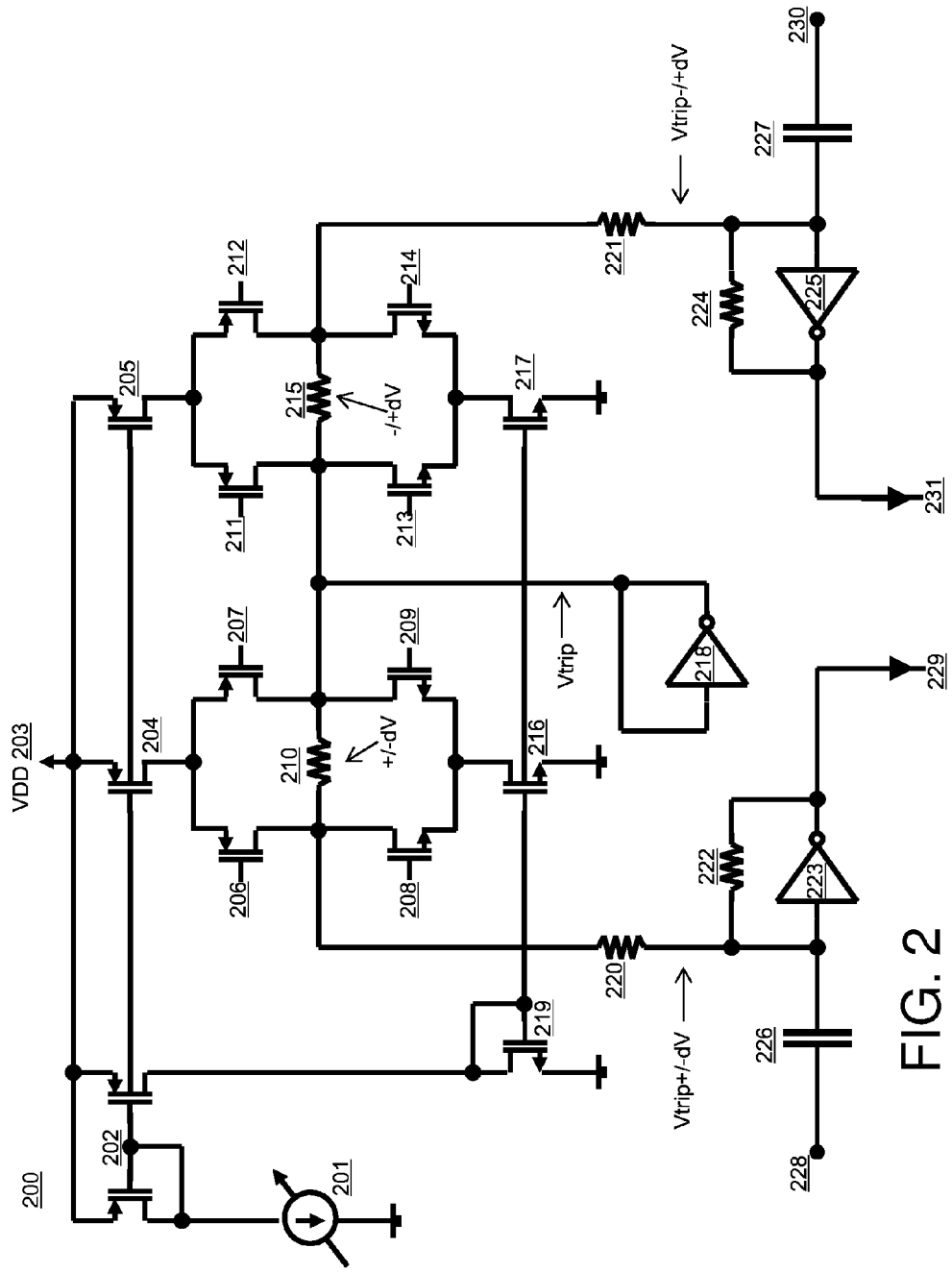
FIG. 2 is a circuit diagram illustrating an embodiment of a differential duty cycle adjustment circuit with differential delta ($\delta$) voltage generators.

FIG. 2 is a circuit diagram showing an embodiment of a differential duty cycle adjustment circuit 200 including differential δV generators. Duty cycle adjustment circuit outputs differential clock signals at clock outputs 229 and 231. Duty cycle adjustment circuit 200 receives an input current from a variable current source 201. The input current from variable current source 201 is supplied via p-type field effect transistors (pFETs) 202 and n-type field effect transistor 219 to a pair of differential δV generators. The first δV generator includes pFETs 206 and 207, resistor 210, and n-type field effect transistors (nFETs) 208 and 209, and is connected to ground via nFET 216 and to $V_{dd}$ power supply 203 via pFET 204. The second δV generator includes pFETs 211 and 212, resistor 215, and n-type field effect transistors (nFETs) 213 and 214, and is connected to ground via nFET 217 and to $V_{dd}$ power supply 203 via pFET 205. pFETs 206/207 and nFETs 208/209 operate as sign selection transistors for the first δV generator. Similarly, pFETs 211/212 and nFETs 213/214 operate as sign selection transistors for the second δV generator. If transistors 206/211 and 209/214 are on and transistors 207/212 and 208/213 are off, the voltage across resistor 210 is equal to +δV, and the voltage across resistor 215 is equal to -δV. Likewise, if transistors 207/212 and 208/213 are on, and transistors 206/211 and 209/214 are off, the voltage across resistor 210 is equal to -δV, and the voltage across resistor 215 is equal to +δV. $V_{trip}$ is supplied by control voltage inverter 218, which is an inverter that is selected such that is has substantially the same $V_{trip}$ as inverters 223 and 225. A first $V_{control}$, equal to $V_{trip}+δV$ or $V_{trip}-δV$ depending on the state of the various transistors as discussed above, is supplied via resistor 220 to the input of inverter 223, where the first $V_{control}$ is added to first clock input signal 228 that is provided via capacitor 226. A second $V_{control}$, equal to $V_{trip}-δV$ or $V_{trip}+δV$, also depending on the state of the various transistors as discussed above, is supplied via resistor 221 to the input of inverter 225, where the second $V_{control}$ is added to the second clock input signal 230 that is supplied via capacitor 227. Feedback resistor 222 is connected across inverter 223, and feedback resistor 224 is connected across inverter 225. The clock signals output by inverters 223 and 225 at clock outputs 229 and 231 are differential output clock signals. The variable current source 201 may be controlled based on the observed duty cycle of the differential output clock signals at clock outputs 229 and 231 to meet a target duty cycle for the system that comprises duty cycle adjustment circuit 200; the duty cycles of the differential output clock signals may be adjusted simultaneously to have a substantially identical duty cycle. Control of variable current source 201 for closed loop adjustment of +δV and -δV based on the observed duty cycle at clock outputs 229 and 231 may be performed by any appropriate logic.

Figure 3:
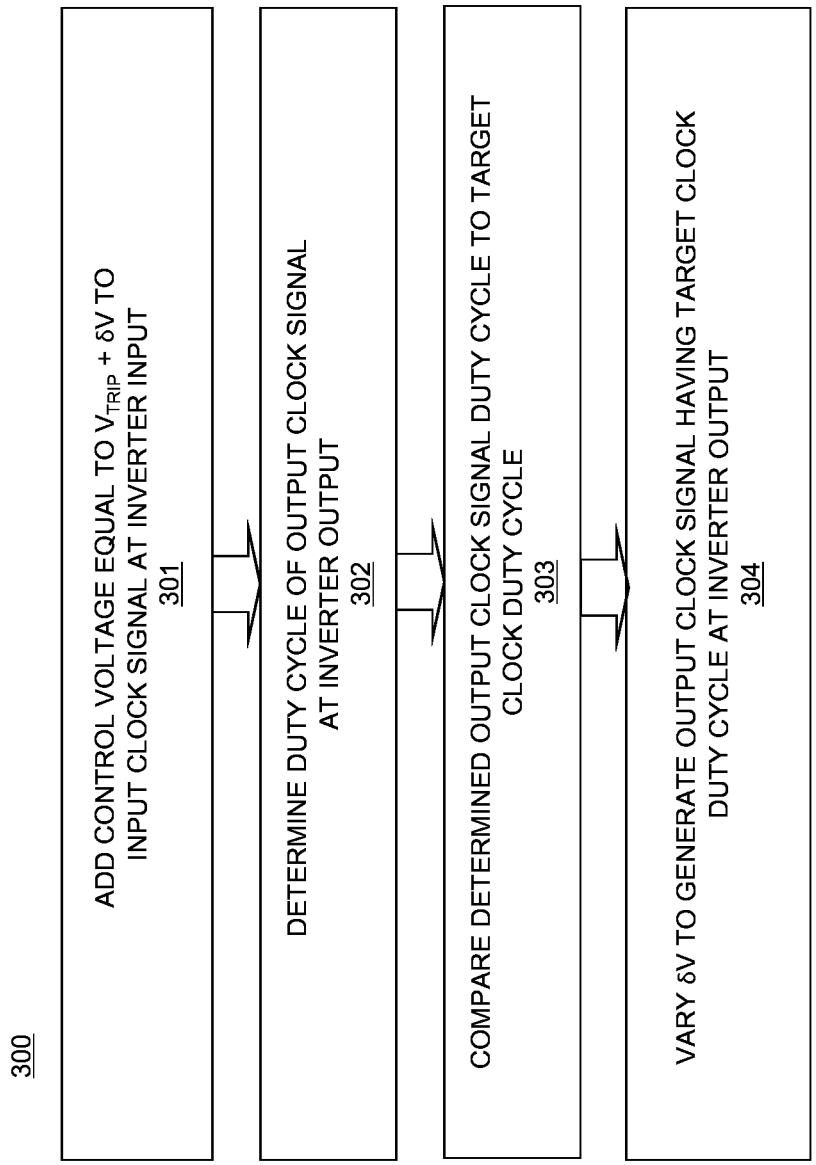
FIG. 3 is a flowchart illustrating an embodiment of a method for closed-loop adjustment of a clock duty cycle.

FIG. 3 is a flowchart illustrating an embodiment of a method 300 for closed-loop adjustment of a clock duty cycle. Method 300 may be implemented in any appropriate logic in conjunction with a duty cycle adjustment circuit, such as duty cycle adjustment circuit 100 of FIG. 1 or duty cycle adjustment circuit 200 of FIG. 2. First, in block 301, a $V_{control}$ equal to $V_{trip}+δV$ is added to a input clock signal at an input of an inverter (for example, inverters 106 of FIG. 1, or inverters 223 or 225 of FIG. 2) having a resistive feedback loop (for example, feedback resistor 107 of FIG. 1, or feedback resistors 222 or 224 of FIG. 2). Then, in block 302 of FIG. 3, a duty cycle of an output clock signal at the output of the inverter is determined. This output clock signal duty cycle is then compared to a target clock duty cycle for the system that includes the duty cycle adjustment circuit in block 303. Flow then proceeds to block 304, in which the δV is varied to meet the target clock duty cycle at the inverter output. The δV may be varied in any appropriate manner by any appropriate circuitry.

Figure 4:
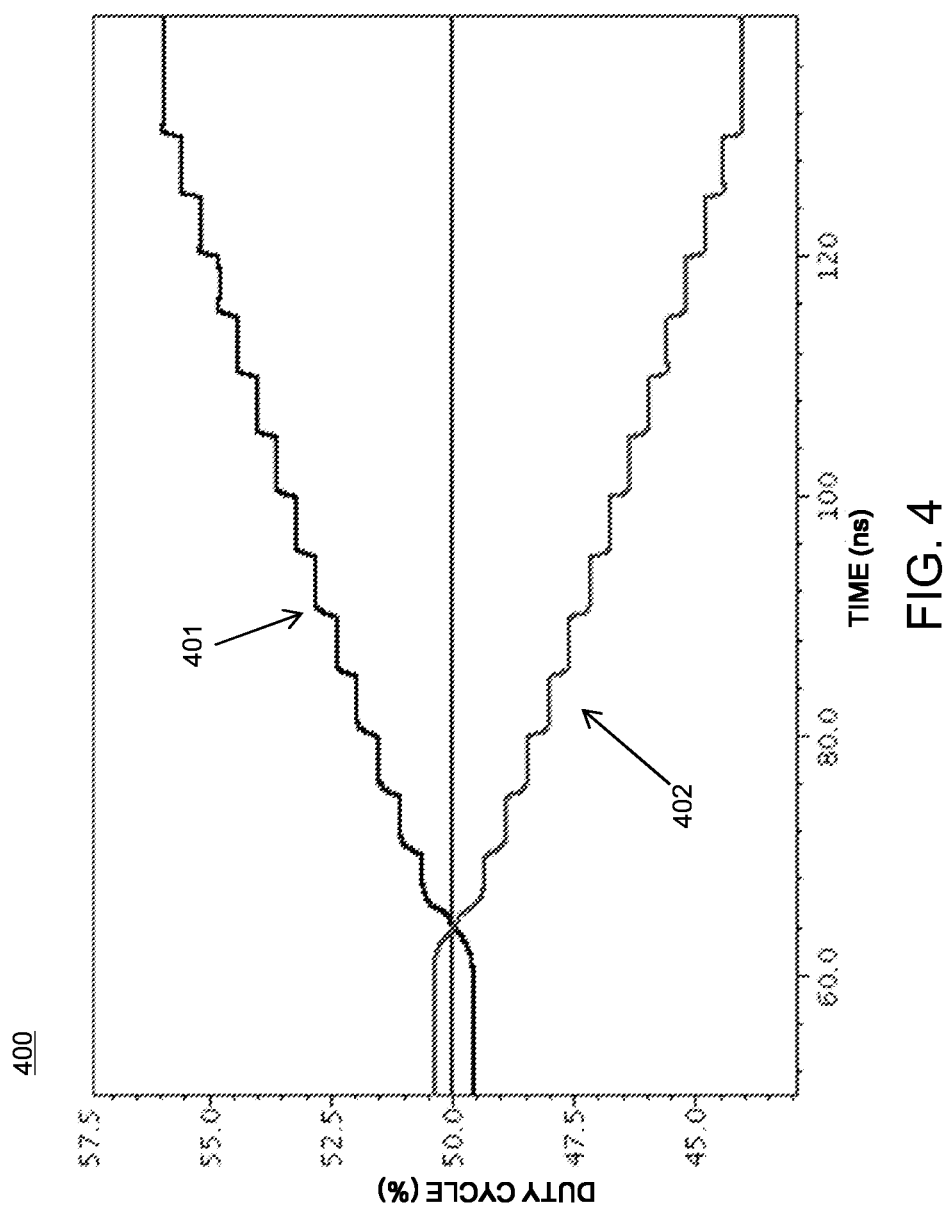
FIG. 4 is a graph showing an embodiment of variation of duty cycle over time for an example duty cycle adjustment circuit.
Figure 5:
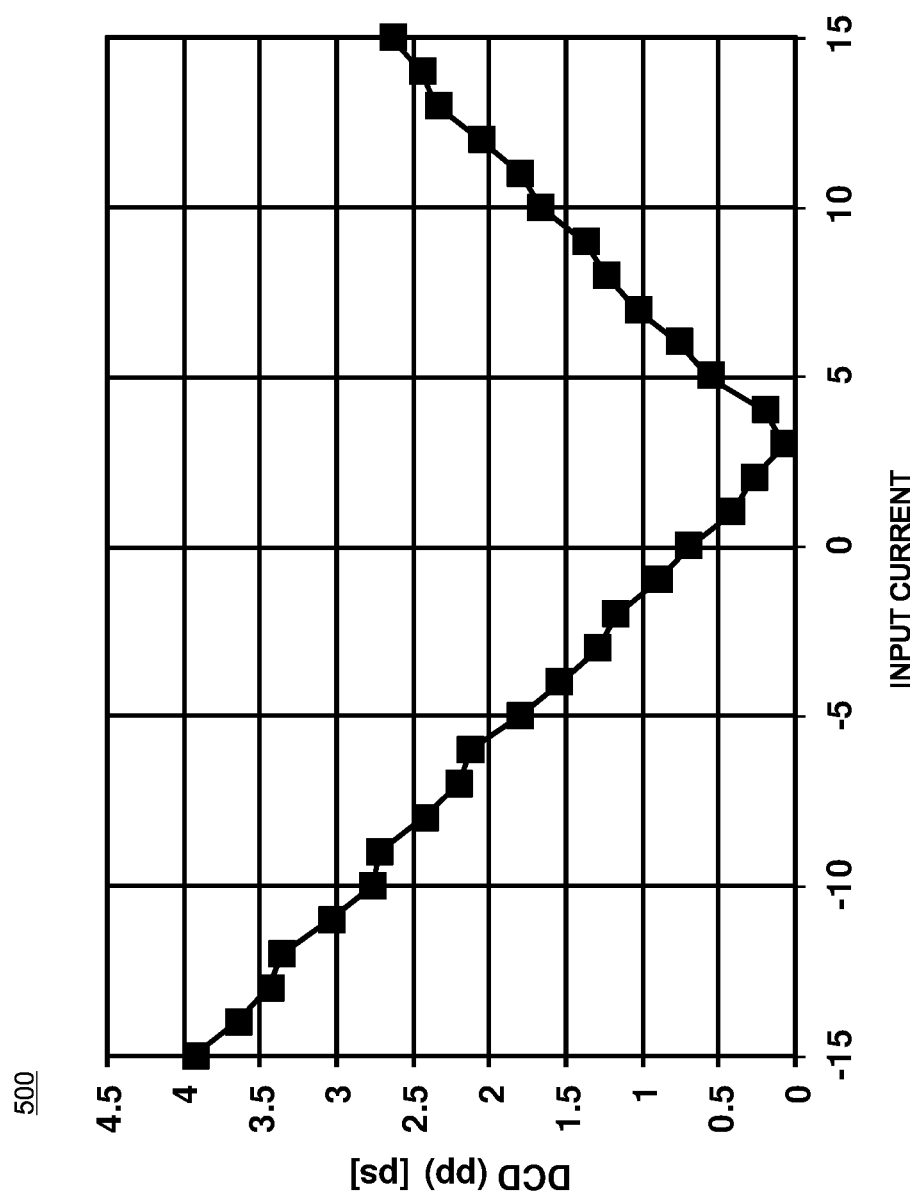
FIG. 5 is a graph showing an embodiment of duty cycle distortion versus input current setting for an example duty cycle adjustment circuit.

FIG. 4 shows a graph 400 illustrating an example of duty cycle variation over time, showing an effective range over which the duty cycle may be varied by an example duty cycle adjustment circuit. Line 401 shows a range of upward duty cycle adjustment, and line 402 shows a range of downward duty cycle adjustment. While a full range of duty cycle adjustments (i.e., from 0% to 100%) may not be made through adjustment of δV, the duty cycle may be effectively adjusted from about 45% to about 55% in some embodiments, which is sufficient to meet target duty cycle requirements for many computing systems. FIG. 5 shows a graph 500 illustrating an example of duty cycle distortion (DCD, in picoseconds) versus input current (i.e. the current provided for generation of δV) for an example duty cycle adjustment circuit. Duty cycle distortion is the variance that a particular clock signal exhibits from a target duty cycle. As shown in FIG. 5, the DCD may be set at zero by supplying an appropriate input current, thereby achieving the target clock duty cycle at the inverter output of the duty cycle adjustment circuit.

The technical effects and benefits of exemplary embodiments include variation of clock duty cycle over a range of values to achieve and maintain a target duty cycle for an electronics system.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A duty cycle adjustment circuit, comprising:
    a differential control voltage generation circuit, comprising:
        first and second delta voltage generators;
        a variable current source configured to supply an input current, via a first p-type field effect transistor (pFET) and a first n-type FET (nFET), to the first and second delta voltage generators, wherein the first delta voltage generator outputs a positive delta voltage based on the input current, and the second delta voltage generator outputs a negative delta voltage based on the input current; and
        a control voltage inverter that is biased at a trip voltage of the control voltage inverter, and that is configured to output the trip voltage, and wherein the differential control voltage generator outputs a first control voltage equal to the trip voltage plus the delta voltage to a first inverter, and a second control voltage equal to the trip voltage minus the delta voltage to a second inverter;
    the first inverter, the first inverter having a trip voltage that is about the same as the trip voltage of the control voltage inverter, configured to receive a first inverter input signal comprising a sum of a first input clock signal received at a first clock signal input node and the first control voltage received from the differential control voltage generation circuit, and to output a first output clock signal, wherein variation of the input current by the variable current source is configured to vary a duty cycle of the first output clock signal; and
    the second inverter, the second inverter having a trip voltage that is about the same as the trip voltage of the control voltage inverter, configured to receive a second inverter input signal comprising a sum of a second input clock signal received at a second clock signal input node and the second control voltage received from the differential control voltage generation circuit, and to output a second output clock signal, wherein variation of the input current by the variable current source is configured to vary a duty cycle of the second output clock signal.

2. The duty cycle adjustment circuit of claim 1, further comprising a first feedback resistor connected in parallel across the first inverter, and a second feedback resistor connected in parallel across the second inverter.

3. The duty cycle adjustment circuit of claim 1, further comprising a first clock input capacitor connected in series between the first clock signal input node and the first inverter, and a second clock input capacitor connected in series between the second clock signal input node and the second inverter.

4. The duty cycle adjustment circuit of claim 1, wherein the variable current source comprises a current digital-analog converter.

5. The duty cycle adjustment circuit of claim 1, wherein variation of the control voltage comprises closed loop adjustment of the control voltage based on the duty cycle of the first and second output clock signals to meet a target duty cycle, wherein the duty cycle of the first output clock signal is about equal to the duty cycle of the second output clock signal.

6. The duty cycle adjustment circuit of claim 1, wherein the first and second delta voltage generators each comprise:
    respective first and second sign selection pFETs each connected to a power supply via a power supply pFET, and each connected to the variable current source via the first pFET;
    respective first and second sign selection nFETs each connected to ground via a ground nFET, and each connected to the variable current source via the first nFET; and
    a respective delta voltage generation resistor connected between the first and second sign selection pFETs and the first and second sign selection nFETs.

7. The duty cycle adjustment circuit of claim 6, wherein the control voltage inverter is connected between the respective delta voltage generation resistors of the first and second delta voltage generators.

8. The duty cycle adjustment circuit of claim 6, wherein the first control voltage is supplied to the first inverter via a first resistor that is located between the delta voltage generation resistor of the first delta voltage generator and the first inverter; and
    wherein the second control voltage is supplied to the second inverter via a second resistor that is located between the delta voltage generation resistor of the second delta voltage generator and the second inverter.

9. A method for duty cycle adjustment of a clock signal by a duty cycle adjustment circuit comprising a first inverter, comprising:
    receiving a first input clock signal at a first clock signal input;
    receiving a first control voltage from a differential control voltage generation circuit, wherein the first control voltage is equal to a trip voltage plus a delta voltage;
    inputting a sum of the first input clock signal and the first control voltage to an input of the first inverter;
    outputting a first output clock signal at a first clock signal output of the first inverter;
    receiving a second input clock signal at a second clock signal input;
    receiving a second control voltage from the differential control voltage generation circuit, wherein the second control voltage is equal to the trip voltage minus the delta voltage;
    inputting a sum of the second input clock signal and the second control voltage to an input of the second inverter;
    outputting a second output clock signal at a second clock signal output of the second inverter; and
    varying the first and second control voltages by the differential control voltage generation circuit to vary a duty cycle of the first and second output clock signals.

10. The method of claim 9, wherein the duty cycle adjustment circuit further comprises a first feedback resistor connected in parallel across the first inverter, and a second feedback resistor connected in parallel across the second inverter.

11. The method of claim 9, wherein the duty cycle adjustment circuit further comprises a first clock input capacitor connected in series between the first clock signal input node and the first inverter, and a second clock input capacitor connected in series between the second clock signal input node and the second inverter.

12. The method of claim 9, wherein varying the first and second control voltages comprises varying of the delta voltage.

13. The method of claim 9, wherein the differential control voltage generation circuit comprises a control voltage inverter biased at the trip voltage.

14. The method of claim 12, wherein the differential control voltage generation circuit comprises a variable current source, and wherein the delta voltage is varied based on variable current source.

15. The method of claim 14, wherein the variable current source comprises a current digital-analog converter.

16. The method of claim 9, wherein varying the control voltage comprises closed loop adjustment of the control voltage based on the duty cycle of the first and second output clock signals to meet a target duty cycle, and wherein the duty cycle of the first output clock signal is about equal to the duty cycle of the second output clock signal.

17. The method of claim 9, wherein the differential control voltage generation circuit comprises:
    first and second delta voltage generators;
    a variable current source configured to supply an input current, via a first p-type field effect transistor (pFET) and a first n-type FET (nFET), to the first and second delta voltage generators, wherein the first delta voltage generator outputs a positive delta voltage based on the input current, and the second delta voltage generator outputs a negative delta voltage based on the input current; and
    a control voltage inverter that is biased at a trip voltage of the control voltage inverter, and that is configures to output the trip voltage, and wherein the differential control voltage generator outputs the first control voltage equal to the trip voltage plus the delta voltage to the first inverter, and the second control voltage equal to the trip voltage minus the delta voltage to the second inverter.

18. The method of claim 17, wherein the first and second delta voltage generators each comprise:
    respective first and second sign selection pFETs each connected to a power supply via a power supply pFET, and each connected to the variable current source via the first pFET;
    respective first and second sign selection nFETs each connected to ground via a ground nFET, and each connected to the variable current source via the first nFET; and
    a respective delta voltage generation resistor connected between the first and second sign selection pFETs and the first and second sign selection nFETs.

19. The method of claim 17, wherein the control voltage inverter is connected between the respective delta voltage generation resistors of the first and second delta voltage generators.

20. The method of claim 17, wherein the first control voltage is supplied to the first inverter via a first resistor that is located between the delta voltage generation resistor of the first delta voltage generator and the first inverter; and
    wherein the second control voltage is supplied to the second inverter via a second resistor that is located between the delta voltage generation resistor of the second delta voltage generator and the second inverter.

* * * * *